United States Patent [19]
Cabler

[11] Patent Number: 5,446,460
[45] Date of Patent: Aug. 29, 1995

[54] FOURTH-ORDER CASCADED SIGMA-DELTA MODULATOR

[75] Inventor: Carlin D. Cabler, Austin, Tex.

[73] Assignee: Advanced Micro Devices, Inc., Sunnyvale, Calif.

[21] Appl. No.: 147,062

[22] Filed: Nov. 3, 1993

[51] Int. Cl.⁶ .......................................... H03M 3/02
[52] U.S. Cl. .................................. 341/143; 375/247
[58] Field of Search ........................ 341/143, 118; 375/25-34

[56] References Cited

U.S. PATENT DOCUMENTS

| | | | |
|---|---|---|---|
| 4,704,600 | 11/1987 | Uchimura et al. | 341/143 |
| 4,920,544 | 8/1990 | Endo et al. | 375/26 |
| 5,061,928 | 10/1991 | Karema et al. | 341/143 |
| 5,065,157 | 11/1991 | Ribner et al. | 341/143 |
| 5,084,702 | 1/1992 | Ribner | 341/143 |
| 5,103,229 | 4/1992 | Ribner | 341/143 |
| 5,148,166 | 9/1992 | Ribner | 341/143 |
| 5,153,593 | 10/1992 | Walden et al. | 341/143 |
| 5,283,578 | 2/1994 | Ribner et al. | 341/143 |
| 5,298,900 | 3/1994 | Mauthe et al. | 341/143 |

OTHER PUBLICATIONS

"A Comparison of Modulator Networks for High-Order Oversampled ΣΔ Analog-to-Digital Converters," D. B. Ribner, *IEEE Transactions on Circuits and Systems*, (1991) Feb., No. 2, pp. 145–159.

*Primary Examiner*—Marc S. Hoff
*Attorney, Agent, or Firm*—Fulbright & Jaworski

[57] ABSTRACT

A method of cascading sigma-delta modulators includes the step of feeding the input to the quantizer of each modulator stage to the subsequent stage. Therefore, the signal which is fed to each of the subsequent stages is the difference between the output and the quantization noise of the previous stage. The method also includes the step of removing the quantization noise of the first two stages, as well as the output of the first two stages, so that the final output of the cascaded modulators is a delayed version of the input, plus a scaled version of the last stage which has been shaped with a fourth-order high pass function.

3 Claims, 5 Drawing Sheets

FOURTH-ORDER CASCADED SIGMA-DELTA MODULATOR

CROSS-REFERENCE TO RELATED APPLICATION

This application is related to U.S. patent application Ser. No. 08/112,610, which was filed on Aug. 26, 1993, which is assigned to the assignee of the present invention, and which is incorporated herein in its entirety by this reference thereto.

BACKGROUND OF THE INVENTION

1. Field of the Invention

The present invention relates generally to sigma-delta modulators. More particularly, the present invention relates to methods of cascading sigma-delta modulators.

2. Description of Related Art

Oversampled interpolative (or sigma-delta) modulators comprise at least one integration stage or filter followed by a quantization stage (most typically a comparator) and a feedback from the output of the quantization stage to the input of the integration stage. Depending upon the number of integration stages, sigma-delta modulators can be divided into order types, e.g., second-order, third-order, or fourth-order.

Sigma-delta modulators have come to be commonly used to perform analog-to-digital (A/D) and digital-to-analog (D/A) conversion in a number of applications. These applications include coder-decoders (codecs), integrated services digital network (ISDN) equipment, and audio equipment.

The use of higher order sigma-delta modulators has become desirable in many applications for several reasons. One reason is because the introduction of higher order modulators increases the number of integrations to be carried out, which results in a decrease in the noise level of the passband as the quantization noise is shifted to a higher frequency level. Another reason is because the use of higher order modulators keeps the oversampling ratio (i.e., the ratio of the modulator clock to the Nyquist rate) low, which is desirable under certain conditions.

A number of efforts have heretofore been undertaken to develop higher order sigma-delta modulators. Five such efforts, those undertaken by Matsuya et al., Ribner, Chao et al., Karema et al., and the inventor of the present invention, Cabler, are discussed immediately below.

Matsuya, et al., in "A 16-Bit Oversampling A-D Conversion Technology Using Triple-Integration Noise Shaping", IEEE Journal of Solid State Circuits, Vol. SC-22, No. 6, pp. 921–929, December, 1987, have presented a method of cascading three or more first-order modulators in order to provide higher order noise shaping. A block diagram of this circuit is shown in FIG. 1 in the related application incorporated herein. The technique employed in this circuit, well known to those skilled in the art as the "MASH" technique, is described at length in U.S. Pat. No. 5,061,928 to Karema. That discussion is incorporated herein by this reference thereto. Although the circuit in FIG. 1 in the related application could be discussed at length, given the level of skill of those skilled in the art, it suffices here to say that the circuit of that figure depicts three cascaded first-order modulators (each generally designated by reference numeral 2). Each first-order modulator 2 comprises an integrator 4 and a quantizer 6. The difference between the output signals of the integrators 4 and the quantizers 6 of the two topmost modulators 2 are fed to subsequent modulators 2. By doing this, quantized noise is moved up out of band, where it can be subsequently, and easily, filtered out. The MASH technique has a number of shortcomings however. First, the MASH technique requires tight matching of the characteristics of the modulators to achieve good resolution. The MASH technique also requires high op amp gains to accomplish the same results. Further, the technique has been shown to be quite sensitive to analog component mismatch when used as an A/D converter. Mismatches in the analog circuitry result in uncancelled quantization noise leaking into the passband. Theoretically, however, with regard to the circuit of FIG. 1 in the related application, if the input to the converter is given as x, and the quantization error of the last modulator is given as $E_3$, the output, y, can be expressed as follows:

$$y = xz^{-3} + E_3(1-z^{-1})^3$$

As previously mentioned, Ribner also has worked to develop higher order sigma-delta modulators. Ribner, in "A Third-Order Multistage Sigma-Delta Modulator with Reduced Sensitivity to Nonidealities", IEEE J. Solid-State Circuits, Vol. 26, No. 12, pp. 1764–1774, December, 1991, and in U.S. Pat. Nos. 5,148,167, 5,148,166, and 5,065,157, has presented a method of cascading a second-order modulator with a first-order modulator. A block diagram of this circuit is shown in FIG. 2 in the related application wherein the second-order modulator is generally designated with reference numeral 8 and the first-order modulator generally designated with reference numeral 10. Referring to the bottommost portion of FIG. 2 in the related application, it is depicted that Ribner teaches combining the quantized outputs $y_1$, $y_2$ of the modulators 8,10 in such a manner that the quantization noise of the second-order section is cancelled while the quantization noise of the first-order section is shaped in a third-order manner. Once again, mathematically, if the input to the converter is given as x, and the quantization error of the first-order modulator is given as $E_2$, the output, y, can be expressed as follows:

$$y = z^{-3}x + C(1-z^{-1})^3 E_2$$

In this case a gain of 1/C was added between the modulators 8,10 in order to prevent the second modulator 10 from overflowing. In order to compensate for the factor of 1/C, a gain of C is added in the correction logic. This can be seen in FIG. 2 in the related application in the form of element 12 (the gain adding portion) and element 14 (the compensation portion).

Chao et al., in "A Higher Order Topology for Interpolative Modulators For Oversampling A/D Converters, IEEE Transactions on Circuits and Systems, Vol. 37, No. 3, pp. 309–318, March, 1990, have proposed a single loop structure for higher order sigma-delta modulators. These modulators consist of a multitude of integrators, feed-forward paths, feed-back paths, and a single quantizer in order to synthesize the desired noise shaping. These modulators suffer from the possibility that they may enter into a mode of self sustained oscillations for certain input values. Various methods have been proposed to desensitize these converters to this phenomena, all of which complicate the structure. It has been noted, however, that single stage first- and second-order modulators of this type do not suffer from this phenomena.

For audio applications, it is desired that the signal-to-total distortion, including noise, be equivalent to that of a standard 16-bit linear converter. Simulations have indicated that for an oversampling ratio of 64, and using practical circuit techniques, third-order modulators built based upon any of the above methods will exceed the performance of a standard 16-bit linear converter. However, the amount of margin beyond 16 bits is not very high. Therefore, it is desired that a sigma-delta converter be built with fourth-order noise shaping.

Karema et al., in U.S. Pat. No. 5,061,924, have introduced a fourth-order topology which comprises of a cascade of two second-order modulators. This is shown in FIG. 3 in the related application wherein the two second-order modulators are generally designated with reference numeral 16. As shown therein, a gain of 1/C (in the form of gain element 18) has been added between the two modulators in order to prevent overflow of the second modulator. As in Ribner's modulator depicted in FIG. 2 discussed alone, a digital circuit is added to Karema et al.'s cascade. This circuit, generally designated by reference numeral 20, is set forth at the bottom of FIG. 3 in the related application. This circuit combines the quantized outputs of the two second-order sections $y_1$, $y_2$ in such a manner that the quantization error of the first modulator is cancelled and the quantization error of the second modulator receives fourth-order shaping. Algebraically, if the input to the converter is given as x, and the quantization error of the second modulator is given as $E_2$, then the output y can be expressed as:

$$y = z^{-4}x + C(1-z^{-1})^4 E_2$$

In pending U.S. patent application Ser. No. 08/112,610, the inventor of the present invention teaches a system and method for cascading three sigma-delta modulators. Cabler's system and method involves applying an error signal representing the quantization error of a preceding modulator to a subsequent modulator. The error signal is scaled by a factor before being applied to a subsequent modulator. The quantized error signal of the subsequent modulator is then scaled by the reciprocal of the original scaling factor before being combined with the quantized outputs of the previous modulators. Combining the quantized outputs of the three modulators is performed so as to cancel the quantization error of the previous stages while shaping the noise at the last stage so that most of the noise is placed at high frequencies.

Thus, in Cabler's design, the quantization noise of each stage is obtained by taking the difference between the output and the input of the quantizer of each stage. This quantization noise is then fed to the subsequent stage. A correction network then removes the quantization noise from each of the previous stages in such a manner that the output is simply a delayed version of the input, plus a scaled version of the quantization noise from the last stage which has been shaped with a fourth-order high pass function.

Based upon the foregoing, it should be understood and appreciated that fourth-order sigma-delta modulators have important advantages over lesser order modulators in certain applications. Further on this point, the signal-to-noise ratio (SNR) of ideal sigma-delta modulators is given by the following equation:

$$SNR = (2L+1)\,10\log(OSR) - 10\log(\pi^{2L}/2L+1)$$

where OSR is the oversampling ratio and L is the order of the modulator. For example, if L=3 and the OSR=64, the SNR equals 105 dB. If L=4 and OSR=64, the SNR equals 132.3 dB. Thus, a fourth-order loop has more inherent margin for 16-bit performance than does a third-order loop with the same oversampling ratio. Although fourth-order sigma-delta modulators, such as that taught by Karema et al., have heretofore been proposed, it is a shortcoming and deficiency of the prior art that there are not additional types of such modulators to use.

As discussed at length in the related case, the modulator disclosed therein constitutes a fourth-order sigma-delta modulator that strikes a good balance between use of first-order modulators (which are less expensive than second-order modulators) and use of second-order modulators (which are easier to match than first-order modulators, but which are more expensive). The modulator disclosed in the related case is, however, somewhat complex, and it therefore requires use of a number of analog components. It is a shortcoming and deficiency of the prior art that there is not available a simpler, less expensive version of the Cabler modulator, which could be fruitfully used in many applications.

SUMMARY OF THE INVENTION

The present invention overcomes the shortcomings and deficiencies mentioned above by providing a new method of cascading three sigma-delta modulators. According to the teachings of the present invention, the input of the quantizer of each stage is fed to the subsequent stage. Thus, a difference between the output of each quantizer and the input of each quantizer need not be obtained. The signal which is fed to each of the subsequent stages is the difference between the output of the previous stage and the quantization noise of the previous stage. Embodiments of the present invention include a correction network which removes both the quantization noise of the first two stages, as well as the output of the first two stages. Thus, the final output of the cascaded modulators is a delayed version of the input thereto, plus a scaled version of the last stage which has been shaped with a fourth-order high pass function.

Accordingly, an object of the present invention is to provide a system and method for accomplishing high resolution A/D conversion.

Another object of the present invention is to provide a new type of fourth-order sigma-delta modulator.

Yet another object of the present invention is to provide an A/D converter in which fewer subtractions must take place between stages as compared to prior art converters and, thus, in which fewer analog components are required.

BRIEF DESCRIPTION OF THE DRAWINGS

Other objects, advantages, and novel features of the present invention may best be understood by reference to the following detailed description taken in conjunction with the accompanying drawings in which.

DETAILED DESCRIPTION OF THE INVENTION

Figure 1:
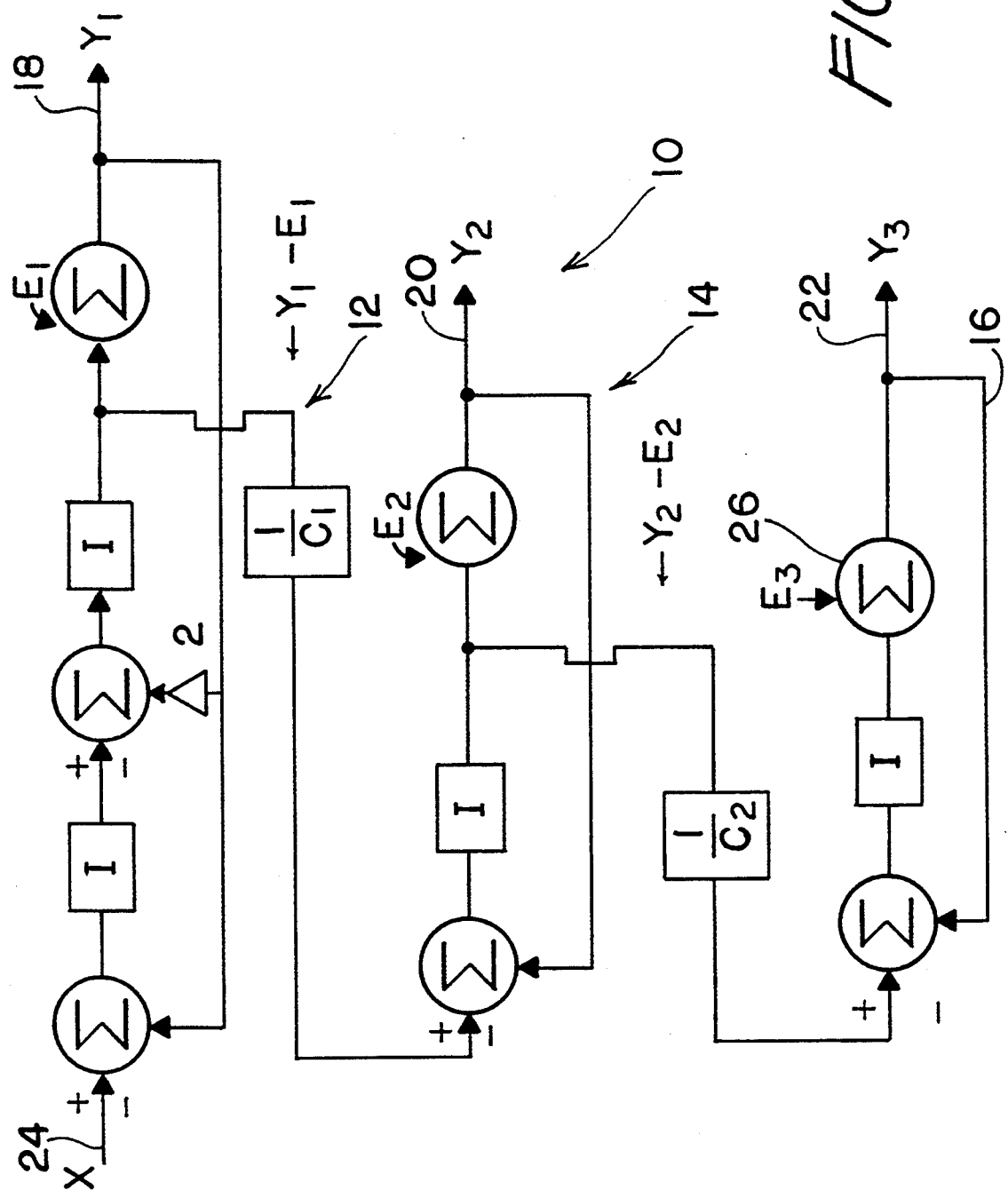
FIG. 1 is a schematic diagram of an embodiment of the present invention.

Referring now to the drawings wherein like or similar elements are designated with identical reference numerals throughout the several views and, more particularly, to FIG. 1, there is shown a schematic diagram of an embodiment of the present invention generally designated by reference numeral 10. The embodiment 10 comprises a conventional second-order sigma-delta modulator (generally designated by reference numeral 12), a first first-order sigma-delta modulator (generally designated by reference numeral 14), and a second first-order sigma-delta modulator (generally designated by reference numeral 16).

As is well known to those skilled in the art, the standard equation for a second-order sigma-delta modulator is:

$$y = z^{-2}x + (1-z^{-1})^2 E$$

where E is the quantization error. As is also well known to those skilled in the art, the standard equation for a first-order sigma-delta modulator is:

$$y = z^{-1}x + (1-z^{-1})E.$$

Applying the standard equations to FIG. 1 yields:

1) $y_1 = z^{-2}x + (1-z^{-1})^2 E_1$;

2) $y_2 = \frac{1}{C_1} z^{-1}y_1 - \frac{1}{C_1} z^{-1}E_1 + (1-z^{-1})E_2$;

and

3) $y_3 = \frac{1}{C_2} z^{-1}y_2 - \frac{1}{C_2} z^{-1}E_2 + (1-z^{-1})E_3.$

To determine the most straightforward and useful correction logic, it is necessary to combine $y_1$, $y_2$, and $y_3$ so that the combined overall output ("$y_{out}$") is only a function of the input, x, and $E_3$ (which is fourth-order shaped).

This goal can be accomplished as follows:

Step 1) Multiply $y_3$ by $C_2$, resulting in $y_4$:

$$y_4 = z^{-1}y_2 - z^{-1}E_2 + C_2(1-z^{-1})E_3$$

Step 2) Subtract $z^{-1}y_2$ from $y_4$, resulting in $y_5$:

$$y_5 = -z^{-1}E_2 + C_2(1-z^{-1})E_3$$

Step 3) Multiply $y_5$ by $(1-z^{-1})$, resulting in $y_6$:

$$y_6 = -z^{-1}(1-z^{-1})E_2 + C_2(1-z^{-1})^2 E_3$$

Step 4) Multiply $y_2$ by $z^{-1}$, resulting in $y_7$:

$$y_7 = \frac{1}{C_1} z^{-2}y_1 - \frac{1}{C_1} z^{-2}E_1 + z^{-1}(1-z^{-1})E_2$$

Step 5) Add $y_6 + y_7$, resulting in $y_8$:

$$y_8 = \frac{1}{C_1} z^{-2}y_1 - \frac{1}{C_1} z^{-1}E_1 + C_2(1-z^{-1})^2 E_3$$

Step 6) Multiply $y_8$ by $C_1$, resulting in $y_9$:

$$y_9 = z^{-2}y_1 - z^{-2}E_1 + C_1 C_2 (1-z^{-1})^2 E_3$$

Step 7) Subtract $z^{-2}y_1$ from $y_9$, resulting in $y_{10}$:

$$y_{10} = -z^{-2}E_1 + C_1 C_2 (1-z^{-1})^2 E_3$$

Step 8) Multiply $y_{10}$ by $(1-z^{-1})^2$, resulting in $y_{11}$:

$$y_{11} = -z^{-2}(1-z^{-1})^2 E_1 + C_1 C_2 (1-z^{-1})^4 E_3$$

Step 9) Multiply $y_1$ by $z^{-2}$ yielding $y_{12}$:

$$y_{12} = z^{-4}x + z^{-2}(1-z^{-1})^2 E_1$$

Step 10) Add $y_{11} + y_{12}$, resulting in $y_{out}$:

$$y_{out} = z^{-4}x + C_1 C_2 (1-z^{-1})^4 E_3$$

Figure 2:
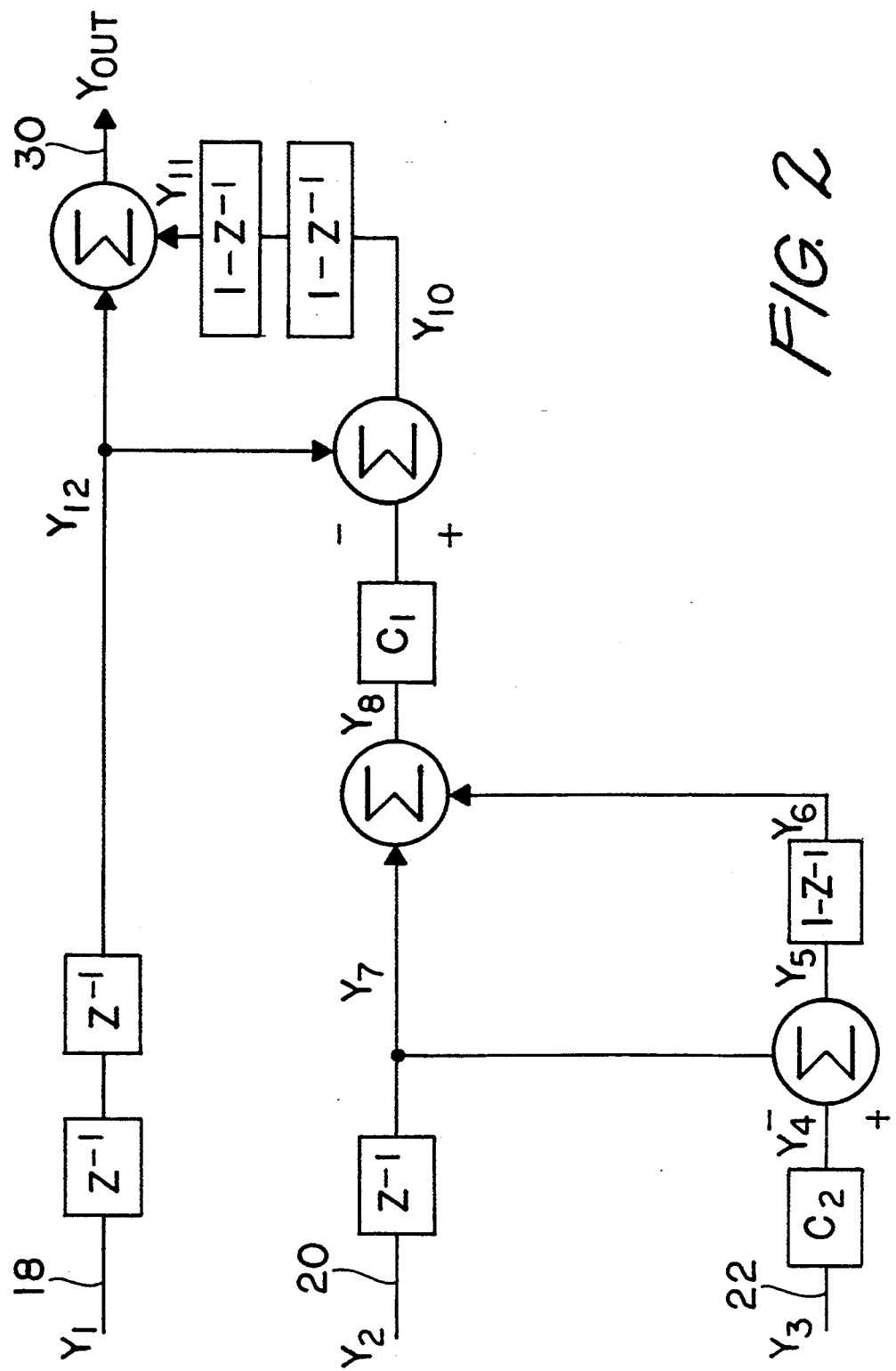
FIG. 2 is a schematic diagram of a correction network according to the teachings of the present invention.

The foregoing can be converted to block diagram form as depicted in FIG. 2. Thus the $y_1$, $y_2$, and $y_3$ outputs depicted in FIG. 1 and therein labeled with reference numerals 18, 20, and 22, respectively, which are generated in the circuit of FIG. 1 when an input x (labeled with reference numeral 24) is applied to it, can be "corrected" with the circuit of FIG. 2 to yield an overall output, $y_{out}$ 30, that is a function only of the input × 24 and $E_3$ 26 (which is fourth-order shaped).

Beginning with the same three equations set forth above, i.e.,

1) $y_1 = z^{-2}x + (1-z^{-1})^2 E_1$;

2) $y_2 = \frac{1}{C_1} z^{-1}y_1 - \frac{1}{C_1} z^{-1}E_1 + (1-z^{-1})E_2$;

and

3) $y_3 = \frac{1}{C_2} z^{-1}y_2 - \frac{1}{C_2} z^{-1}E_2 + (1-z^{-1})E_3.$ an alternative correction network can be obtained by performing the following steps:

Step 1)
$y_4 = C_1 y_2$
$= -z^{-1}y_1 - z^{-1}E_1 + C_1(1-z^{-1})E_2$

Step 2)
$y_5 = y_4 - z^{-1}y_1$
$= -z^{-1}E_1 + C_1(1-z^{-1})E_2$

Step 3)
$y_6 = C_2 y_3$
$= -z^{-1}y_2 z^{-1}E_2 + C_2(1-z^{-1})E_3$

-continued

Step 4)
$$y_7 = y_6 - z^{-1}y_2$$
$$= -z^{-1}E_2 + C_2(1 - z^{-1})E_3$$

Step 5)
$$y_8 = C_1(1 - z^{-1})y_7$$
$$= -z^{-1}C_1(1 - z^{-1})E_2 + C_1C_2(1 - z^{-1})^2E_3$$

Step 6)
$$y_9 = z^{-1}y_5$$
$$= -z^{-2}E_1 + C_1z^{-1}(1 - z^{-1})E_2$$

Step 7)
$$y_{10} = y_8 + y_9$$
$$= -z^{-2}E_1 + C_1C_2(1 - z^{-1})^2E_3$$

Step 8)
$$y_{11} = z^{-2}y_1$$
$$= z^{-4}x + z^2(1 - z^{-1})^2E_1$$

Step 9)
$$y_{12} = (1 - z^{-1})^2 y_{10}$$
$$= -z^{-2}(1 - z^{-1})^2E_1 + C_1C_2(1 - z^{-1})^4E_3$$

Step 10)
$$y_{out} = y_{11} + y_{12}$$
$$= z^{-4}x + C_1C_2(1 - z^{-1})^4E_3$$

Figure 3:
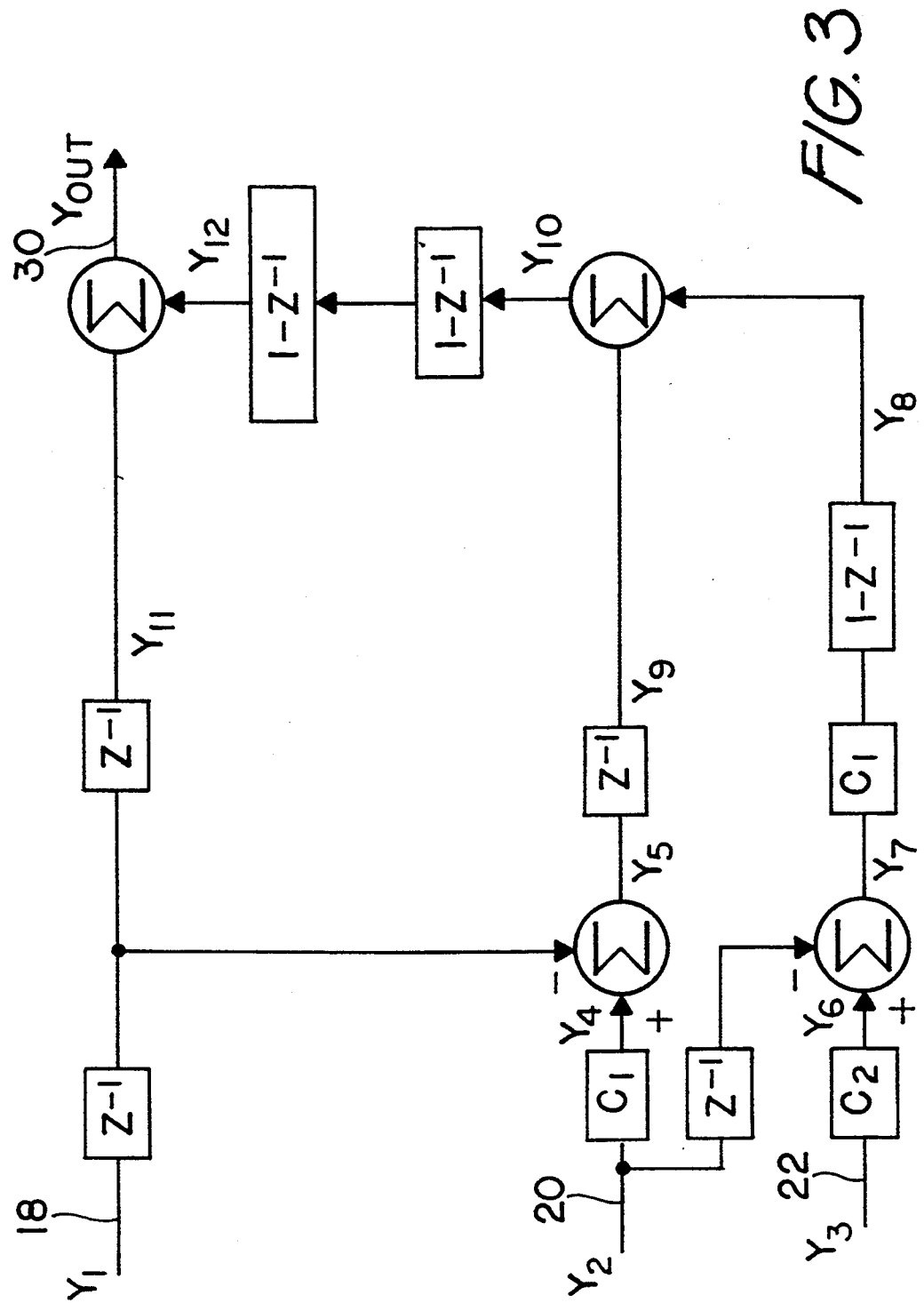
FIG. 3 is a schematic diagram of an alternative correction network according to the teachings of the present invention.

The foregoing can be converted to block diagram form as depicted in FIG. 3.

Still yet another alternative "correction network" can be obtained as follows. Beginning with:

1) $y_1 = z^{-2}x + (1-z^{-1})^2E_1$;

2) $y_2 = \frac{1}{C_1}z^{-1}y_1 - \frac{1}{C_1}z^{-1}E_1 + (1 - z^{-1})E_2$;

3) $y_3 = \frac{1}{C_2}z^{-1}y_2 - \frac{1}{C_2}z^{-1}E_2 + (1 - z^{-1})E_3$.

one can perform the following steps:

Step 1) Multiply $y_2$ by $C_1$, resulting in $y_4$:

$$y_4 = z^{-1}y_1 - z^{-1}E_1 + C_1(1-z^{-1})E_2$$

Step 2) Subtract $z^{-1}y_1$ from $y_4$, resulting in $y_5$:

$$y_5 = -z^1E_1 + C_1(1-z^{-1})E_2$$

Step 3) Multiply $y_5$ by $(1-z^{-1})^2$, resulting in $y_6$:

$$y_6 = -z^{-1}(1-z^{-1})^2E_1 + C_1(1-z^{-1})^3E_2$$

Step 4) Multiply $y_1$ by $z^{-1}$, resulting in $y_7$:

$$y_7 = z^{-3}x + z^{-1}(1-z^{-1})^2E_1$$

Step 5) Add $y_6$ to $y_7$, resulting in $y_8$:

$$y_8 = z^{-3}x + C_1(1-z^{-1})^3E_2$$

Step 6) Multiply $y_3$ by $C_2$, resulting in $y_9$:

$$y_9 = z^{-1}y_2 - z^{-1}E_2 + C_2(1-z^{-1})E_3$$

Step 7) Subtract $z^{-1}y_2$ from $y_9$, resulting in $y_{10}$:

$$y_{10} = -z^{-1}E_2 + C_2(1-z^{-1})E_3$$

Step 8) Multiply $y_{10}$ by $(1-z^{-1})^3$, resulting in $y_{11}$:

$$y_{11} = -z^{-1}(1-z^{-1})^3E_2 + C_2(1-z^{-1})^4E_3$$

Step 9) Multiply $y_{11}$ by $C_1$, resulting in $y_{12}$:

$$y_{12} = -C_1 z^{-1}(1-z^{-1})^3 E_2 + C_1C_2(1-z^{-1})^4E_3$$

Step 10) Multiply $y_8$ by $z^{-1}$, resulting in $y_{13}$:

$$y_{13} = z^{-4}x + C_1Z^{-1}(1-z^{-1})^3$$

Step 11) Add $y_{12}$ to $y_{13}$, resulting in $y_{out}$:

$$y_{out} = z^{-4}x + C_1C_2(1-z^{-1})^4E_3$$

Figure 4:
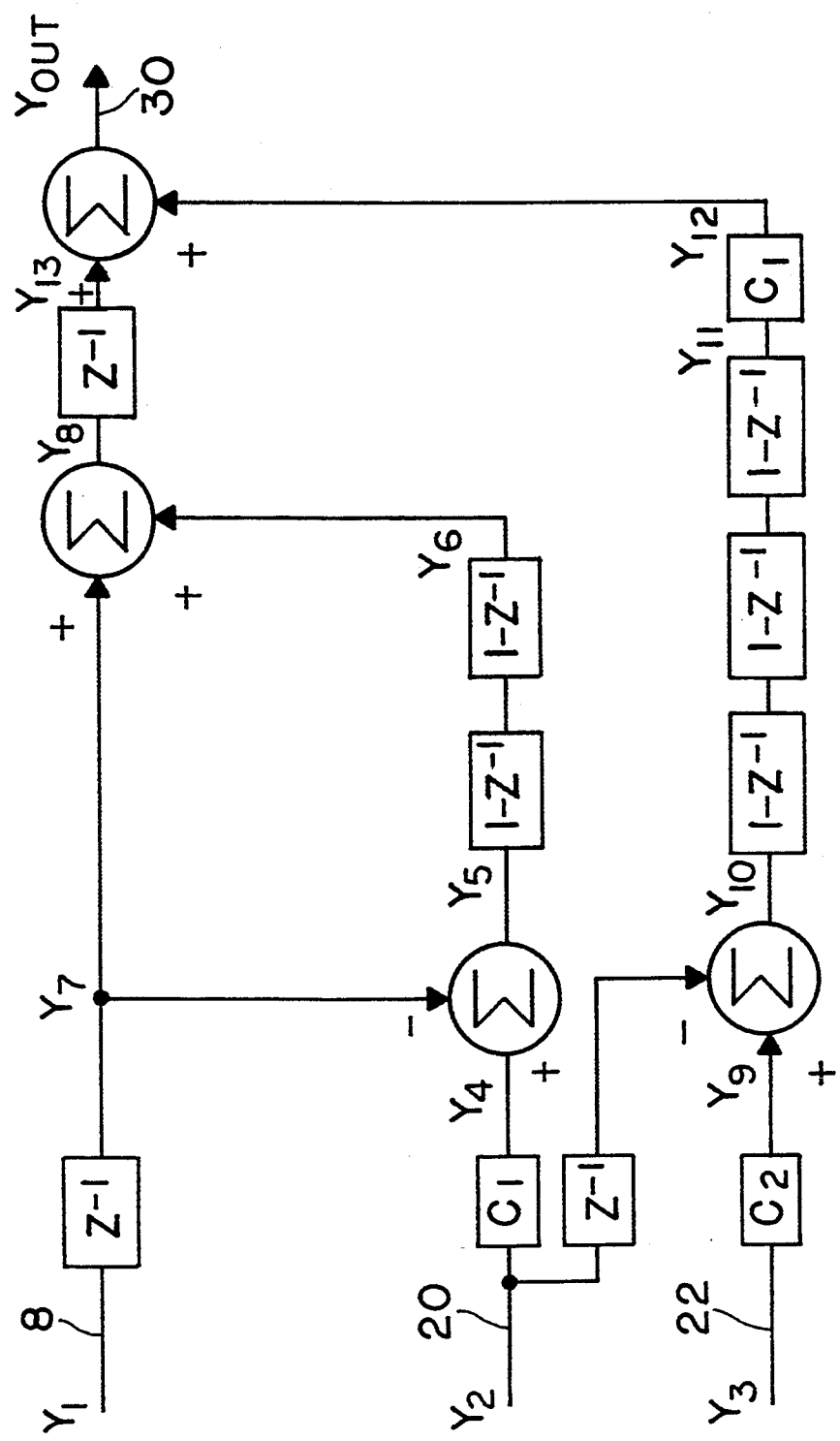
FIG. 4 is a schematic diagram of yet another alternative correction network according to the teachings of the present invention.

The foregoing can be converted to block diagram form as depicted in FIG. 4.

Figure 5:
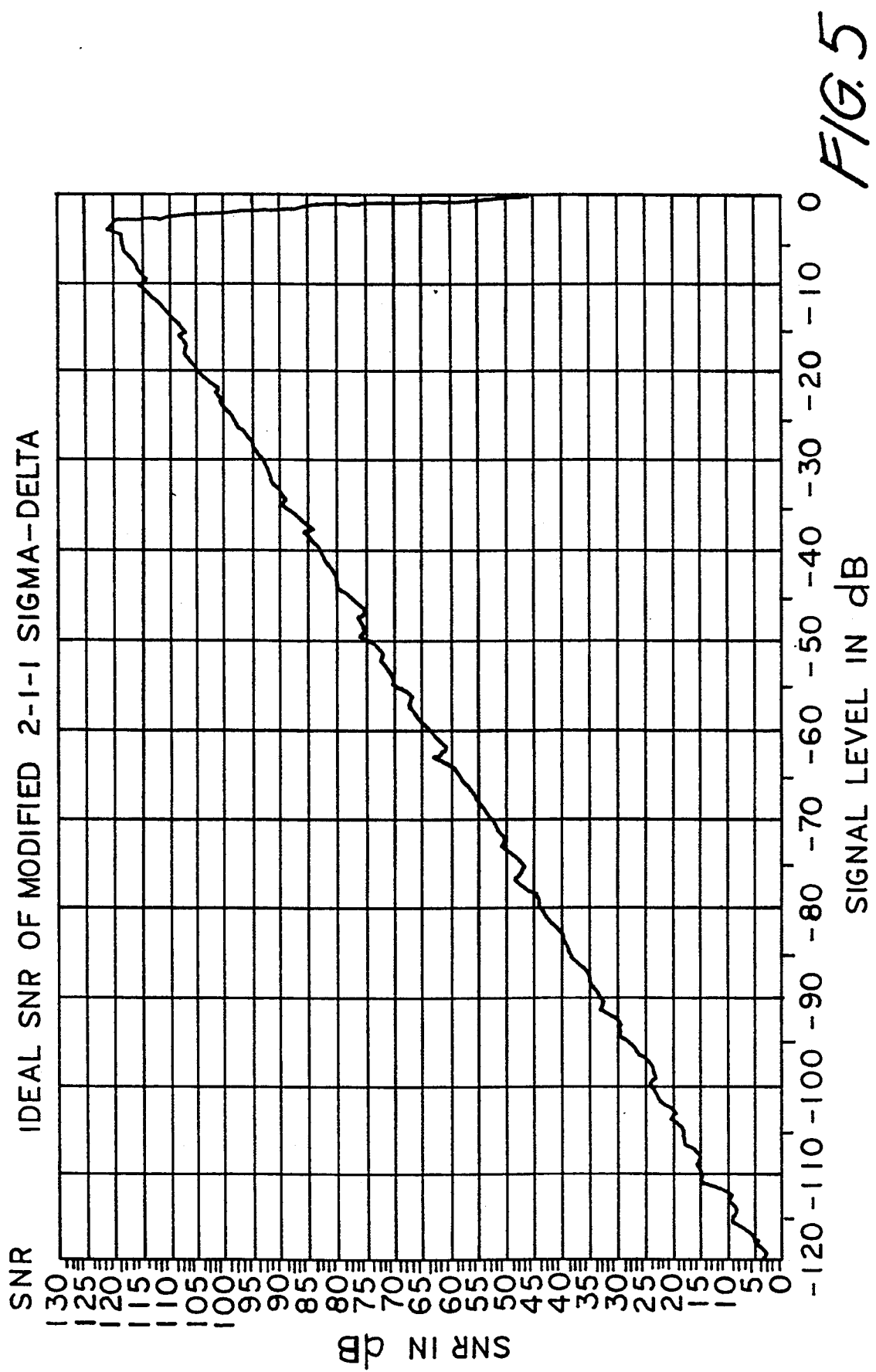
FIG. 5 is a plot of simulated SNR performance for an embodiment of the present invention.

Referring now to FIG. 5, there is shown a plot of simulated Signal to Noise (SNR) performance for a "modified 2-1-1" modulator according to the teachings of the present invention with $C_1=4$ and $C_2=2$.

Based upon the foregoing, those skilled in the art should understand and appreciate how the present invention provides a new method of cascading three sigma-delta modulators. According to the teachings of the present invention, the input of the quantizer ($E_1$, $E_2$, $E_3$) of each stage is fed to the subsequent stage. Thus, the signal which is fed to each of the subsequent stages is the difference between the output of the previous stage and the quantization noise of the previous stage. Embodiments of the present invention include a correction network (three examples of which are explicitly depicted herein) which removes both the quantization noise of the first two stages, as well as the output of the first two stages. The final output, $y_{out}$, of embodiments of the present invention is a delayed version of the input, plus a scaled version of the last stage which has been shaped with a fourth-order high pass function. Embodiments of the present invention constitute a marked advance over the prior art, insofar as they constitute improved fourth-order sigma-delta modulators, improved systems and methods for accomplishing high resolution A/D conversion, and insofar as they can provide an A/D converter in which fewer subtractions must take place between stages as compared to prior art converters and, thus, in which fewer analog components are required.

Obviously, numerous modifications and variations are possible in view of the above teachings. Accordingly, within the scope of the appended claims, the present invention may be practiced otherwise than as specifically described hereinabove.

What is claimed is:

1. A method of cascading an initial second-order sigma-delta modulator, an intermediate first-order sigma-delta modulator, and a final first order modulator, each modulator having a quantizer, said cascading method comprising the steps of:

applying a first signal to the initial modulator quantizer to develop an initial signal;

scaling said first signal by a first predetermined factor to produce a scaled first signal;

applying said scaled first signal to the intermediate modulator to develop a second signal;

applying said second signal to the intermediate modulator quantizer to develop an intermediate signal;

scaling said second signal by a second predetermined factor to produce a scaled second signal;

applying said scaled second signal to the final modulator to develop a third signal;

applying said third signal to the final modulator quantizer to develop a final signal;

scaling said final signal by the reciprocal of the second predetermined factor to produce a scaled final signal;

delaying said intermediate signal by one sampling period to produce a delayed intermediate signal;

subtracting said delayed intermediate signal from said scaled final signal to produce a difference signal;

differentiating said difference signal to produce a differentiated difference signal;

summing said differentiated difference signal and said delayed intermediate signal to produce a summed signal;

scaling said summed signal by the reciprocal of the first predetermined factor to produce a scaled summed signal;

delaying said initial signal by two sampling periods to produce a delayed initial signal;

subtracting said delayed initial signal from said scaled summed signal to produce a summed difference signal;

twice differentiating said summed difference signal to produce a differentiated summed signal; and summing said differentiated summed signal and said delayed initial signal to produce an output signal.

2. A method of cascading an initial second-order sigma-delta modulator, an intermediate first-order sigma-delta modulator, and a final first-order modulator, each modulator having a quantizer, said cascading method comprising the steps of:

applying a first signal to the initial modulator quantizer to develop an initial signal;

scaling said first signal by a first predetermined factor to produce a scaled first signal;

applying said scaled first signal to the intermediate modulator to develop a second signal;

applying said second signal to the intermediate modulator quantizer to develop an intermediate signal;

scaling said second signal by a second predetermined factor to produce a scaled second signal;

applying said scaled second signal to the final modulator to develop a third signal;

applying said third signal to the final modulator quantizer to develop a final signal;

scaling said intermediate signal by the reciprocal of the first predetermined factor to produce a scaled intermediate signal;

delaying said initial signal by one sampling period to produce a delayed initial signal;

subtracting said delayed initial signal from said scaled intermediate signal to produce an intermediate difference signal;

scaling said final signal by the reciprocal of the second predetermined factor to produce a scaled final signal;

delaying said intermediate signal by one sampling period to produce a delayed intermediate signal;

subtracting said delayed intermediate signal from said scaled final signal to produce a final difference signal;

differentiating said final difference signal to produce a differentiated final difference signal;

scaling said differentiated final difference signal by the reciprocal of the first predetermined factor to produce a scaled differentiated signal;

delaying said intermediate difference signal to produce a delayed intermediate difference signal;

summing said delayed intermediate difference signal and said scaled differentiated signal to produce a summed signal;

delaying said initial signal by two sampling periods to produce a second delayed initial signal;

twice differentiating said summed signal to produce a differentiated summed signal;

summing said differentiated summed signal and said second delayed initial signal to produce an output signal.

3. A method of cascading an initial second-order sigma-delta modulator, an intermediate first-order sigma-delta modulator, and a final first-order modulator, each modulator having a quantizer, said cascading method comprising the steps of:

applying a first signal to the initial modulator quantizer to develop an initial signal;

scaling said first signal by a first predetermined factor to produce a scaled first signal;

applying said scaled first signal to the intermediate modulator to develop a second signal;

applying said second signal to the intermediate modulator quantizer to develop an intermediate signal;

scaling said second signal by a second predetermined factor to produce a scaled second signal;

applying said scaled second signal to the final modulator to develop a third signal;

applying said third signal to the final modulator quantizer to develop a final signal;

scaling said intermediate signal by the reciprocal of the first predetermined factor to produce a scaled intermediate signal;

delaying said initial signal by one sampling period to produce a delayed initial signal;

subtracting said delayed initial signal from said scaled intermediate signal to produce an intermediate difference signal;

twice differentiating said intermediate difference signal to produce a differentiated difference signal;

summing said delayed initial signal and said differentiated difference signal to produce a summed signal;

scaling said final signal by the reciprocal of said second predetermined factor to produce a scaled final signal;

delaying said intermediate signal to produce a delayed intermediate signal;

subtracting said delayed intermediate signal from said scaled final signal to produce a final difference signal;

differentiating said final difference signal to produce a differentiated final difference signal;

scaling said differentiated final difference signal by the reciprocal of the first predetermined factor to produce a scaled final difference signal;

delaying said summed signal by one sampling period to produce a delayed summed signal; and summing said delayed summed signal and said scaled final difference signal to produce an output signal.

* * * * *